United States Patent
Kuroda (10) Patent No.: US 6,384,668 B2
(45) Date of Patent: *May 7, 2002

(54) CHARGE PUMP CIRCUIT

(75) Inventor: Hidehiko Kuroda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/494,331

(22) Filed: Jan. 28, 2000

(30) Foreign Application Priority Data

Jan. 29, 1999 (JP) .......................................... 11-022206

(51) Int. Cl.[7] ................................................ G05F 1/10
(52) U.S. Cl. ....................... 327/536; 327/112; 327/379; 327/537; 326/87
(58) Field of Search ................................ 327/108, 109, 327/112, 157, 374, 376, 377, 278, 536, 537, 551, 558, 272, 379, 380, 381; 326/82, 83, 86, 87

(56) References Cited

U.S. PATENT DOCUMENTS

| | | | | |
|---|---|---|---|---|
| 4,910,416 A | * | 3/1990 | Salcone | 327/374 |
| 5,164,889 A | * | 11/1992 | Ruetz | 327/231 |
| 5,173,627 A | * | 12/1992 | Lien | 326/83 |
| 5,237,213 A | * | 8/1993 | Tanoi | 327/379 |
| 5,365,118 A | * | 11/1994 | Wilcox | 327/109 |
| 5,528,192 A | * | 6/1996 | Agiman | 327/374 |
| 5,534,821 A | * | 7/1996 | Akiyama et al. | 327/157 |
| 5,546,033 A | * | 8/1996 | Campbell et al. | 327/170 |
| 5,801,566 A | * | 9/1998 | Tanaka | 327/244 |
| 5,825,221 A | * | 10/1998 | Takase | 327/108 |
| 5,854,575 A | * | 12/1998 | Fiedler et al. | 327/157 |
| 5,872,473 A | * | 2/1999 | Williams | 327/108 |
| 5,896,058 A | * | 4/1999 | Sanzo et al. | 327/112 |

FOREIGN PATENT DOCUMENTS

| | | |
|---|---|---|
| JP | 7-143002 | 6/1995 |
| JP | 8-18448 | 1/1996 |
| JP | 9-298462 | 11/1997 |
| JP | 9-331250 | 12/1997 |

* cited by examiner

*Primary Examiner*—Timothy P. Callahan
*Assistant Examiner*—An T. Luu
(74) *Attorney, Agent, or Firm*—Hutchins, Wheeler & Dittmar (57) ABSTRACT

The present invention provides a charge pump circuit capable of operating at a high speed with a low power source voltage and increasing the synchronization processing speed. The charge pump circuit comprises: a first switch circuit 15 connected between a first input node 12 through which a first signal CPin1 is input and a base of an NPN transistor Q4, for controlling the NPN transistor Q4 in response to the first signal CPin1; and a second switch circuit 16 connected between a second input node 13 and a base of an NPN transistor Q9, for controlling the NPN transistor Q9 in response to a second signal CPin2. The transistors Q4 and Q9, and transistors contained in the first and the second switch circuits 15 and 16 are all NPN transistors.

12 Claims, 8 Drawing Sheets

CHARGE PUMP CIRCUIT

BACKGROUND OF THE INVENTION

1. Field of the Invention

The present invention relates to a charge pump circuit contained in a PLL frequency synthesizer and in particular, to a charge pump circuit capable of a high speed operation at a low voltage.

2. Description of the Related Art

For example, a mobile communication system such as a global positioning system (GPS) including a mobile telephone unit and car navigation of employs phase locked loop (PLL) frequency synthesizer. Such a PLL frequency synthesizer is disclosed in Japanese Patent Publication No. 7-143002. The PLL frequency synthesizer disclosed here includes: a reference counter; a crystal oscillator; a frequency divider; a phase comparator; a charge pump circuit; a loop filter as a low pass filter; and a voltage control oscillator (VCO).

The PLL frequency synthesizer described in the aforementioned publication operates as follows. When a reference signal based on an oscillation signal of a predetermined frequency is output by the reference counter to the phase comparator, the phase comparator compares the reference signal with a comparison signal and outputs phase difference pulse signals $\phi R$, $\phi P$ according to the comparison result, to the charge pump circuit.

In response to high level/low level of the phase difference pulse signals $\phi R$ and $\phi P$, the charge pump circuit operates a switch unit consisting of a pair of built-in transistors. By the operation of this switch unit, if an ascending voltage signal is output, the loop filter is charged, and if a descending voltage signal is output, the loop filter is discharged. The loop filter flattens the ascending/descending voltage signals from the charge pump circuit and outputs it to the voltage control oscillator, as a control voltage signal from which a high frequency pulse component has been removed.

The voltage control oscillator outputs a frequency signal having frequency corresponding to a voltage value of the control voltage signal from the loop filter, so as to send back the signal to the frequency divider. The aforementioned operation is repeated until the frequency signal of the voltage control oscillator is locked to several times of the frequency of the reference signal.

When using the aforementioned conventional PLL frequency synthesizer in a mobile communication system, with increase of the number of telephone units and variety of uses, it becomes necessary to operate from the ordinary kHz band to the high frequency of MHz band as well as to reduce spurious caused by the phase comparison frequency signal and to increase the synchronization processing speed. In order to realize this, the charge pump circuit should have a function to rapidly respond to the phase comparator of high-speed operation and to charge/discharge the loop filter at a high speed.

SUMMARY OF THE INVENTION

It is therefore an object of the present invention to provide a charge pump circuit capable of operating at a high speed with a low power source voltage and increasing the synchronization processing speed.

The charge pump circuit according to the present invention comprises: a first transistor connected between a first power source and an output node; and a second transistor connected between a second power source and said output node; wherein the first and the second transistors are controlled in response to a first signal and a second signal so as to control a current flowing into and out of the output node, said charge pump circuit further comprising: a first switch circuit connected between a first input node through which the first signal is input and a base of the first transistor and controlling the first transistor in response to the first signal; and a second switch circuit connected between a second input node through which the second signal is input and a base of the second transistor and controlling the second transistor in response to the second signal; wherein the first and the second transistors and transistors contained in the first and the second switch circuits are all NPN transistors.

In the charge pump circuit according to the present invention, the first and the second transistors and the transistors used in the first and the second switch circuit are all NPN transistors using electrons as career. Accordingly, it is possible to realize a high-speed operation at a low voltage in response to a high-speed phase comparison signal, and to charge/discharge the loop filter at the subsequent stage, enabling a high-speed synchronization processing. Moreover, since NPN transistors of identical configuration are formed on a single substrate, it is possible to simplify the production procedure and the circuit configuration and reduce the production cost as well as reduce the lay-out area on the semiconductor chip and reduce the circuit size in comparison to the case when MOS transistors and bipolar transistors are used in combination.

Here, it is preferable that the first switch circuit comprise: a third transistor having a collector connected to the first power source via a first resistor and to the base of the third transistor, which base is connected to the base of the first transistor; a fourth transistor having a collector connected to the collector of the third transistor, an emitter connected to the second power source, and a base connected to the first input node; and a first bias circuit inserted between the third transistor and the second power source. In this case, it is possible to realize the first switch circuit with a simple circuit configuration.

Moreover, it is preferable that the first bias circuit be constituted by a plurality of transistors connected so as to operate as diodes. In this case, it is possible to realize the first bias circuit with a simple circuit configuration.

Alternatively, it is also preferable that the first bias circuit be constituted by: a bias transistor having a collector connected to the emitter of the third transistor and an emitter connected to the second power source; a second resistor connecting the base and collector of the bias transistor; and a third resistor connecting the base and emitter of the bias transistor. In this case also, it is possible to realize the first bias circuit with a simple circuit configuration.

Moreover, it is preferable that the second switch circuit comprise: a second bias circuit connected to the first power source via the second resistor; a fifth transistor having a collector connected to the second bias circuit, an emitter connected to the second power source, and a base connected to the second input node; a sixth transistor having a collector connected to the second bias circuit and to the base of the sixth transistor, which base is connected to the base of the second transistor so as to constitute a current mirror circuit, and an emitter connected to the second power source. In this case, it is possible to realize the second switch circuit with a simple circuit configuration.

It is preferable that the second bias circuit comprise a seventh transistor having a collector connected to the first power source via the second resistor and to the base of the seventh transistor, and an emitter connected to the collector of the sixth transistor. In this case, the second bias circuit can be realized with a simple circuit configuration.

Alternatively, the second bias circuit may comprise a third resistor having one end connected to the first power source via the second resistor and the other end connected to the collector of the sixth transistor. In this case also, the second bias circuit can be realized with a simple circuit configuration.

Moreover, it is preferable that the charge pump circuit further comprise a bias circuit for biasing the output node. In this case it is possible to maintain preferable balance between the charge current and the discharge current flowing to the output node.

Moreover, the bias circuit may comprise: a resistor having one end connected to the output node; and a DC power source having an anode connected to the other end of the resistor and a cathode connected to the second power source. In this case, the output node is biased by a DC power source. This enables to maintain preferable balance between the charge current and the discharge current flowing to the output node.

Alternatively, the bias circuit may comprise: a first resistor having one end connected to the first power source and the other end connected to the output node side; and a second resistor having one end connected to the second power source and the other end connected to the output node side. In this case, the output node is biased by resistance division, which enables to maintain a preferable balance between the charge current and the discharge current flowing to the output node.

Alternatively, the bias circuit may comprise: a bias transistor having a base connected to the output node and an emitter connected to the second power source; and a first resistor inserted between the collector of the bias transistor and the first power source, wherein a connection node between the first resistor and the bias transistor is connected to a subsequent stage output node positioned at a subsequent stage of the output node. In this case, by utilizing voltage between the base and the emitter of the bias transistor, it is possible to output a signal from the subsequent stage output node while the output node is biased. Moreover, because the bias circuit is constituted by a transistor having an emitter grounded, it is possible to convert a current output into voltage and increase the output range of the output signal from the subsequent stage output node from the power source voltage to the collector-emitter saturation voltage of the bias transistor.

Furthermore, the bias circuit having the aforementioned configuration may further comprise: a second resistor inserted between the output node and the base of the bias transistor; and a series circuit constituted by a third resistor and a capacitor inserted in a return path connecting a connection between the first resistor and the subsequent stage output node, with a connection between the base of the bias transistor and the second resistor. In this case, it is possible to obtain a bias circuit which also serves as a loop filter functioning as an active low pass filter.

DESCRIPTION OF THE PREFERRED EMBODIMENTS

The present invention will be detailed below, referring to the attached drawings.

Figure 1:
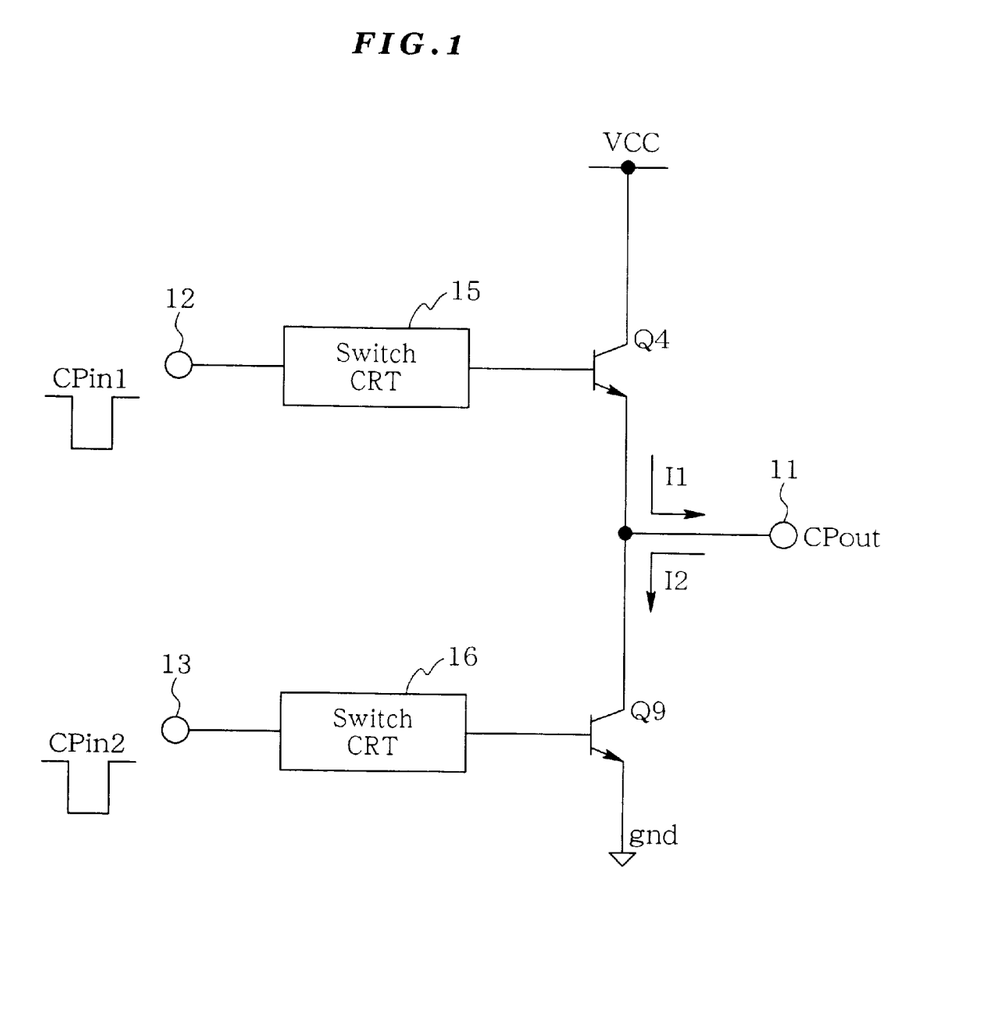
FIG. 1 is a circuit diagram schematically showing a charge pump circuit according to a first embodiment of the present invention.

FIG. 1 is a circuit diagram showing a charge pump circuit according to a first embodiment of the present invention. In this charge pump circuit, between a power source voltage Vcc and ground gnd, there are NPN transistors Q4 and Q9 connected in series. The collector of the NPN transistor Q4 is connected to the power source voltage Vcc (first power source) and the emitter of the NPN transistor Q9 is connected to the ground gnd (second power source), whereas the emitter of the NPN transistor Q4 and the collector of the second NPN transistor Q9 are connected to an output node 11.

Between a first input node 12 and a base of the NPN transistor Q4, there is connected a first switch circuit 15. Between a second input node 13 and a base of the NPN transistor Q9, there is connected a second switch circuit 16.

Figure 2:
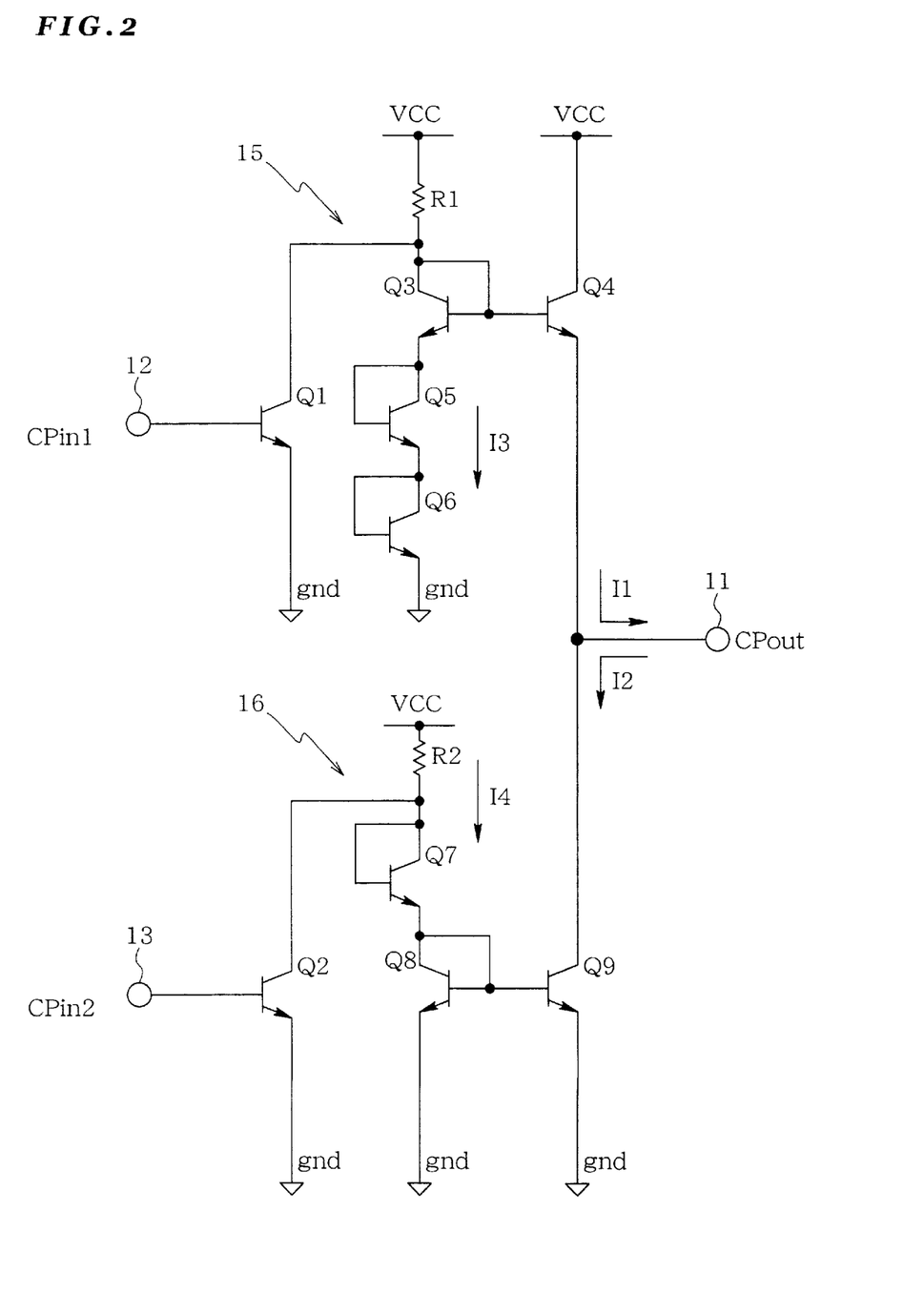
FIG. 2 shows circuit examples of the first and second switch circuits in FIG. 1.

FIG. 2 shows specific examples of the first switch circuit 15 and the second switch circuit 16 in the charge pump circuit of FIG. 1. The first switch circuit 15 includes NPN transistors Q1, Q3, Q4, and Q5 and a resistor R1. The NPN transistor Q1 has a collector connected via the resistor R1 to the power source voltage Vcc, an emitter connected to the ground gnd, and a base connected to the first input node 12. The NPN transistor Q3 has a collector connected via the resistor R1 to the power source voltage Vcc and to a base (diode connection), which base is connected to a base of the NPN transistor Q4 to constitute a current mirror. The emitter of the NPN transistor Q3 is connected to a collector of the NPN transistor Q5.

The NPN transistor Q5 has a collector connected to a base and a base connected to a collector of the NPN transistor Q6. The NPN transistor Q6 has a base connected to a base, and an emitter connected to the ground gnd. The NPN transistors Q5 and Q6 constitute a bias circuit.

The second switch circuit 16 includes NPN transistors Q2, Q7, Q8 and a resistor R2. The NPN transistor Q2 has a collector connected via the resistor 2 to the power source voltage Vcc, an emitter connected to the ground gnd, and a base connected to the second input node 13. The NPN transistor Q7 has a collector connected via the resistor R2 to the power source voltage Vcc and to a base, and an emitter connected to the collector of the NPN transistor Q8. The NPN transistor Q8 has: a collector connected to the base, which base is connected to the base of the NPN transistor Q9 so as to constitute a current mirror, and an emitter connected to the ground gnd.

The charge pump circuit having the aforementioned configuration operates as follows. The first input node 12 and the second input node 13 are supplied with an input signal CPin1 and CPin2, respectively, by a phase comparator (not depicted). For example, when the input signal CPin1 is at low level, the input signal CPin1 from the first input node 12 is supplied to the base of the NPN transistor Q1, and the NPN transistor Q1 is turned off. Here, if the input signal CPin2 is at high level, the input signal CPin2 from the second input node 13 is supplied to the base of the NPN transistor Q2, and the NPN transistor Q2 is turned on.

In the first switch circuit 15, because the NPN transistor Q1 is off, a current (I3)

$$I3=(Vcc-3\cdot V_{BE})/R1$$

flows in a circuit portion constituted by the register R1 and the NPN transistors Q3, Q5, and Q6. Simultaneously with this, the NPN transistor Q4 constituting the current mirror circuit together with the NPN transistor Q3 also turns on and accordingly, a charge current I1 corresponding to the current I3 flows between the collector and the emitter of the NPN transistor Q4.

On the other hand, in the second switch circuit 16, the NPN transistor Q2 turns on and accordingly, a current flows in a circuit portion including the resistor R2 and the NPN transistor Q2, the voltage drop by the resistor R2 turns off the NPN transistors Q7 and Q8. In this case, because no current flows in the NPN transistors Q7 and Q8, the NPN transistor Q9 also turns off, and the collector of the NPN transistor Q9 and the output node 11 are at the same potential as the emitter of the NPN transistor Q4, and the charge current I1 flows in the output node 11. With the aforementioned operation, the first switch circuit 15 turns on and the second switch circuit 16 turns off, so that the charge current I1 flows.

Next, in the opposite case, i.e., when a high input signal CPin1 is supplied to the first input node 12 and a low input signal CPin2 is supplied to the second input node 13, the NPN transistor Q1 turns on and accordingly, the first switch circuit 15 turns off and the NPN transistor Q2 turns off, so that the second switch circuit 16 turns on. Thus, the first and the second switch circuits 15 and 16 operate in the opposite way to the aforementioned and a discharge current I2 flows as an output signal CPout 11 to the output node 11.

That is, because the NPN transistor Q1 turns on, in the first switch circuit 15, current flows to both of the resistor R1 and the NPN transistor Q1, and the voltage drop by the resistor R1 turns off all of the NPN transistors Q3, Q5, and Q6. As a result, the NPN transistor Q4 turns off. Moreover, because the NPN transistor Q2 turns off, in the second switch circuit, a current (I4)

$$I4=(Vcc-2V_{BE})/2$$

flows in a circuit portion constituted by the resistor R2, the NPN transistors Q7 and Q8. This current I4 becomes a collector current of the NPN transistor Q9 by the current mirror circuit constituted by the NPN transistors Q8 and Q9. Here, the NPN transistor Q4 turns off and accordingly, $$I4=I2.$$

And the discharge current I2 flows as an output signal CPout 11 to the output node 11.

As a condition other than the aforementioned, for example, when high input signals are simultaneously supplied to the first and the second input nodes 12 and 13, both of the NPN transistors Q4 and Q9 turn off and accordingly, no current flows to the output node 11 and a high impedance state is set in.

On the contrary, when low input signals are simultaneously supplied to the first and the second input nodes 12 and 13, both of the NPN transistors Q4 and Q9 turn on and current flows to the respective current flow paths. However, by using a phase comparator which does not output this state or outputs only instantaneously, it is possible not to affect the charge pump output.

In this charge pump circuit, the first and the second switch circuits 15 and 16 have the aforementioned configuration and the power source voltage Vcc is reduced, for example, down to $2V_{BE}$ (about 1.5). Accordingly, low voltage operation is available.

Moreover, in the charge pump circuit according to the present embodiment, a constant current circuit which determines charge/discharge is provided with switching transistors (Q1 and Q2), so as to enable to control switching of the constant current circuit itself. This significantly simplifies the circuit configuration. That is, as shown in FIG. 2, the constant current circuit which determines the charge current I1 is a circuit including the resistor R1 and the NPN transistors Q3, Q5, and Q6, in which current $(Vcc-3V_{BE})/R1$ flows when the power source voltage Vcc is constant. The switch transistor is the NPN transistor Q1 which is in open state when off and does not affect the constant current circuit. When the NPN transistor Q1 is on, directs the current to be flown to the resistor R1 and to the NPN transistors Q3, Q5, Q6, to the resistor 1 and the NPN transistor Q1. Thus, no current flows to the NPN transistors Q3, Q5, Q6 and the constant current circuit turns off. Similarly, the constant current circuit which determines the discharge current I2 is constituted by the resistor R2 and the NPN transistors Q7 and Q8. When the power source voltage Vcc is constant, a current $(Vcc-2V_{BE})/R2$ flows. The NPN transistor Q2 is in open state when off. When the NPN transistor Q2 is on, current flows via the resistor R2 and the NPN transistor Q2, and the constant current circuit turns off.

In the circuit configuration of the embodiment shown in FIG. 2, all the transistors are NPN transistors using electrons as carrier. However, it is also possible to use only PNP transistors using positive holes as carrier. In this case, the operation is slightly slowed down compared to the case using only the PNP transistors, but there is a merit that it is possible to simplify the circuit configuration and reduce the lay out area.

Figure 3:
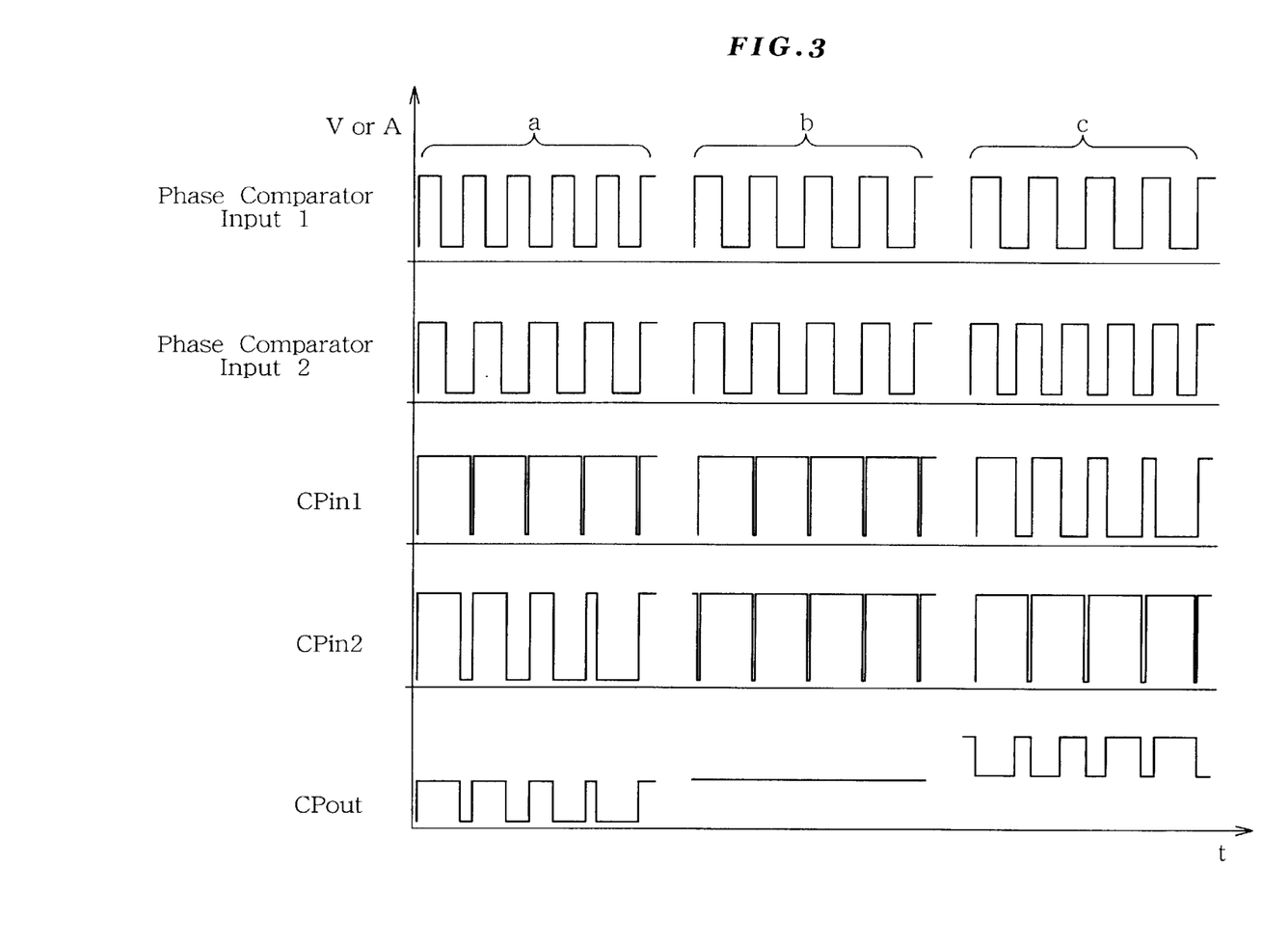
FIG. 3 is a timing chart showing simulation results of respective signals when the charge pump circuit of the first embodiment is used in a PLL frequency synthesizer.

FIG. 3 is a timing chart obtained when the charge pump circuit according to the present embodiment is used in a PLL frequency synthesizer, through simulation of inputs 1 and 2 to the phase comparator, input signals CPin1 and CPin2, and the output signal CPout 11. The horizontal axis represents time t and the vertical axis represents voltage V or current A.

During an interval "a", the phase of the input 2 to the phase comparator delays compared to the phase of the input 1, and during an interval "c" the phase of input 2 advances compared to the phase of the input 1. Accordingly, the input signal CPin2 during the interval "a" is controlled to reduce its pulse width compared to the input signal CPin1, and the input signal CPin1 during the interval "c" is controlled to reduce its width compared to the input signal CPin2. Accordingly, the output signal CPout 11 appears at the discharge side during the interval "a" and at the charge side during the interval "c". Moreover, during an interval "b", the input 1 and the input 2 to the phase comparator have identical phase and accordingly, the input signal CPin1 and the input signal CPin2 are output with an identical pulse width and the output signal CPout 11 appears between the discharge side and the discharge side (high impedance state).

Figure 4:
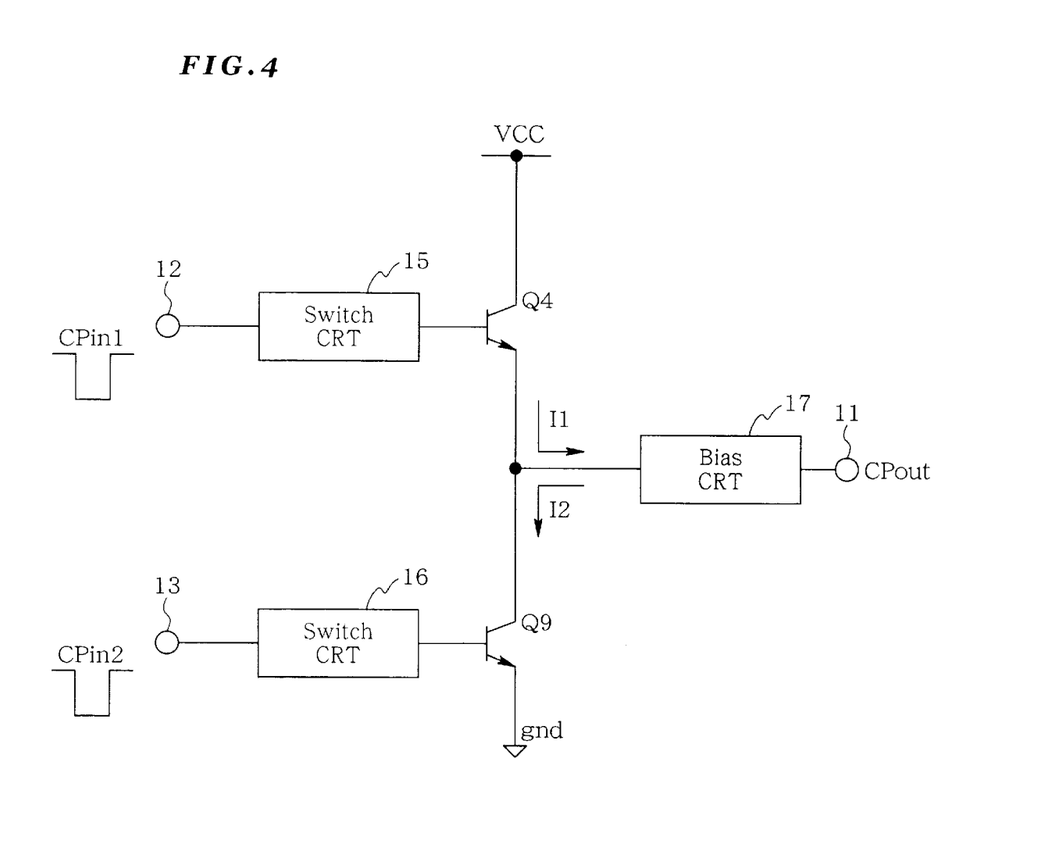
FIG. 4 is a circuit diagram schematically showing a charge pump circuit according to a second embodiment of the present invention.

FIG. 4 shows a charge pump circuit according to a second embodiment of the present invention. In this embodiment, the output node 11 has a bias circuit 17.

With the circuit configuration explained with reference to FIG. 1, the potential of the output node 11 is changed by the load and circuit connected to the output node 11. Accordingly, the charge current I1 and the discharge current I2 may not be constant. If such a phenomenon is caused when the charge pump circuit is used in a PLL frequency synthesizer, the phase noise is increased and spurious (unnecessary signals) due to the phase comparison frequency becomes greater. To cope with this, in this embodiment, in order to eliminate such deficiency, the bias circuit 17 makes bias of the output node 11 to a certain voltage, so that the charge current I1 and the discharge current I2 can be maintained constant.

Next, explanation will be given on specific configuration examples of the bias circuit 17 explained in FIG. 4. FIG. 5 through FIG. 8 show the respective configuration examples of the bias circuit 17.

Figure 5:
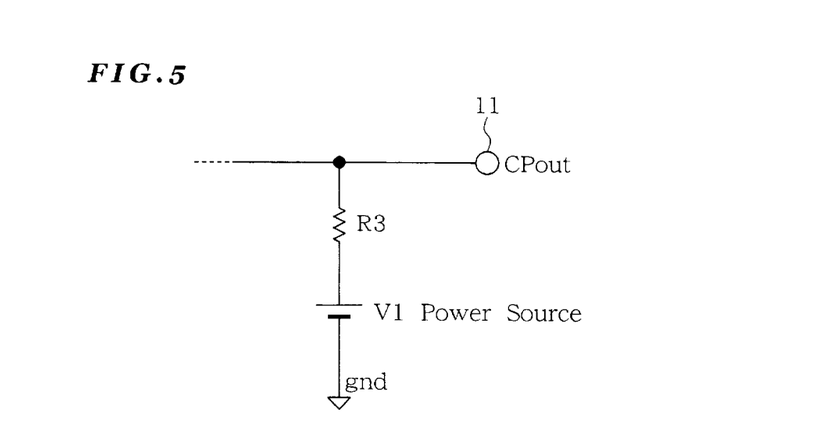
FIG. 5 shows a specific example of a bias circuit in FIG. 4.

In FIG. 5, the bias circuit 17 includes a resistor R3 whose one end is connected to the output node 11, and a DC power source V1 whose anode is connected to the other end of the resistor R3 and whose cathode is connected to the ground gnd. In this example, the output node 11 is biased by the DC power source V1.

Figure 6:
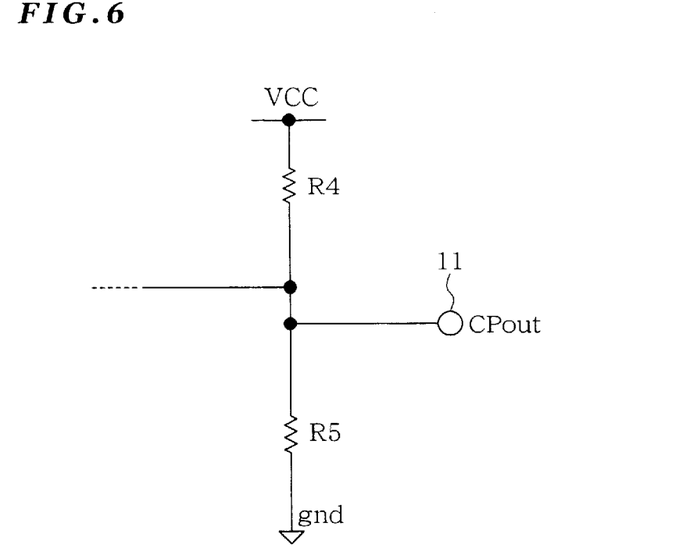
FIG. 6 shows another example of a bias circuit in FIG. 4.

In FIG. 6, the bias circuit 17 includes a resistor R4 whose one end is connected to the power source voltage Vcc and the other end is connected to the output node 11, and a resistor R5 whose one end is connected to the ground gnd and the other end is connected to the output node 11. In this example the output node 11 is biased by resistance division.

Figure 7:
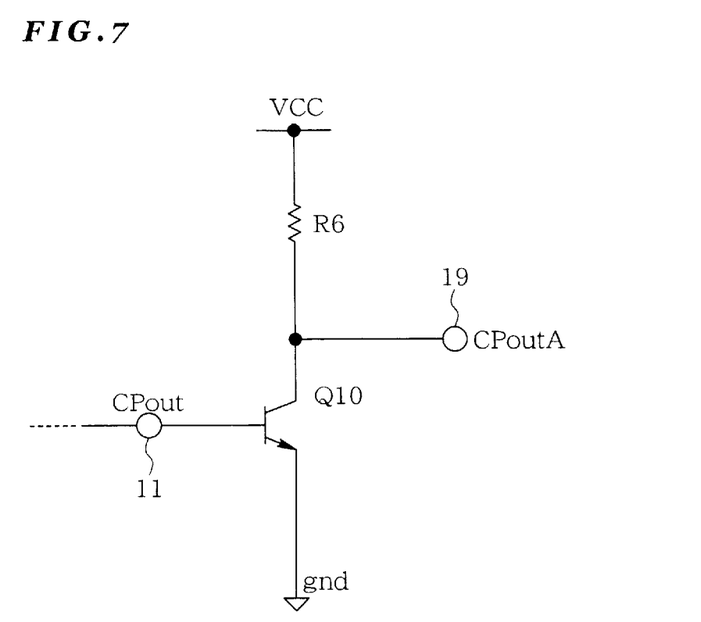
FIG. 7 shows still another example of a bias circuit in FIG. 4.

In the example of FIG. 7, the bias circuit 17 is connected to a subsequent stage of the output node 11. This bias circuit 17 includes an NPN transistor Q10 whose base is connected to the output node 11 and whose emitter is connected to the ground gnd, and a resistor R6 inserted between the collector of the NPN transistor Q10 and the power source voltage Vcc. A connection node between the resistor R6 and the NPN transistor Q10 is connected to the subsequent stage of the subsequent stage output node 19.

In this example, the output node 11 is biased by utilizing a voltage $V_{BE}$ between the base and the emitter of the NPN transistor Q10, and while maintaining a preferable balance of the charge current I1 and the discharge current I2, it is possible to output the output signal CPoutA from the subsequent stage output node 19. Moreover, the bias circuit 17 of this example is constituted by a transistor circuit in which the emitter is grounded and accordingly, it is possible to convert a current output into voltage and to increase the output range of the output signal CPoutA from the power source voltage Vcc to the collector-emitter saturation voltage VCE(sat) (almost the grounding potential).

Figure 8:
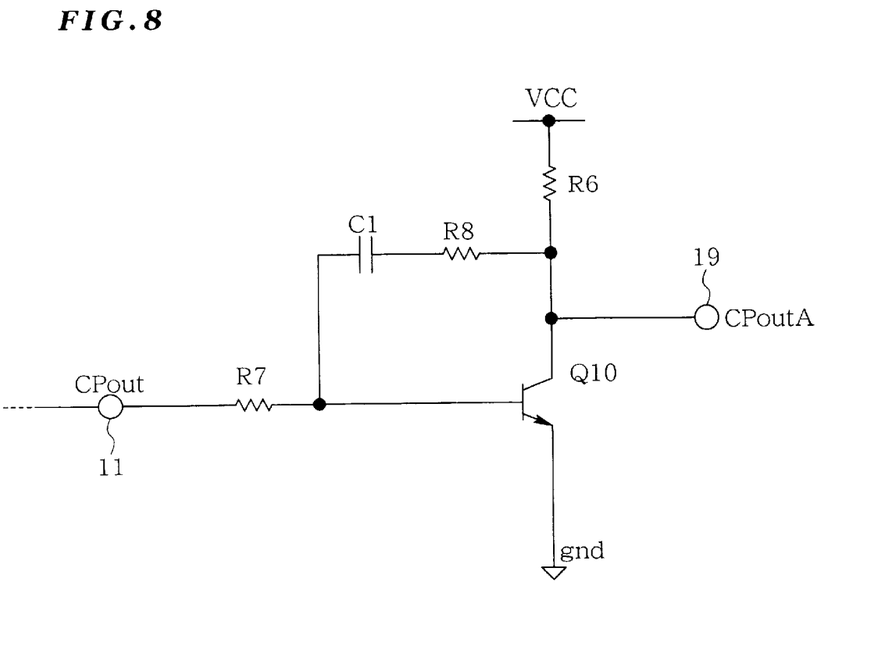
FIG. 8 shows yet another example of a bias circuit in FIG. 4.

In FIG. 8, the bias circuit 17, in addition to the configuration shown in FIG. 6, includes a resistor R7 inserted between the output node 11 and the base of the NPN transistor Q10, and a resistor R8 and a capacitor C1 which are inserted in a feedback path connecting a connection point between the resistor R6 and the subsequent stage output node 19 with a connection point between the base of the NPN transistor Q10 and the resistor R7. The bias circuit 17 having this configuration also serves as a loop filter as an active low pass filter, which is preferable for the PLL frequency synthesizer.

In the aforementioned bias circuit 17, if the NPN transistor Q4 (FIG. 2) turns on and the NPN transistor Q9 (FIG. 2) turns off, a charge current I1 flows in the output node 11. Here, for example, the potential of the output node 11 has been set to $2 \times V_{BE}$. That is, the resistance of the resistor R7 has been set so that relationship between the voltage drop $V_{R7}$ in the resistor R7 and the base-emitter voltage $V_{BE-Q10}$ of the NPN transistor Q10 is satisfies the following equation:

$$V_{R7}+V_{BE\text{-}Q10}=2\times V_{BE} \quad (1)$$

In this case, as the charge current I1, the following current flows:

$$I1=V_{BE}/R7$$

Here, a resistance is set to such a value for the resistor R1 that makes stable the base-emitter voltage $V_{BE}$ in the NPN transistors Q3, Q5, and Q6, and the NON transistor Q4 can drive.

Moreover, when the NPN transistor Q4 is off and the NPN transistor Q9 is on, because of the presence of a current mirror circuit constituted by the NPN transistors Q8 and Q9, as the discharge current I2, the following current expressed by Equation (2) flows.

$$I2=(Vcc-V_{BE\text{-}Q7}-V_{BE\text{-}Q8})/R2$$

$$\approx (Vcc-2\cdot V_{BE})/R2 \quad (2)$$

wherein $V_{BE\text{-}Q7}$ represents a voltage between the base and the emitter of the NPN transistor Q7, $V_{BE\text{-}Q8}$ represents a voltage between the base and the emitter of the NPN transistor Q8, and R2 represents resistance of the resistor R2.

From the Equations (1) and (2) for the charge current I1 and the discharge current I2, the temperature coefficient is as follows for both of them:

$$\partial I/\partial T=\partial(V_{BE}/R)/\partial T$$

Accordingly, although the absolute values of the charge current I1 and the discharge current I2 is changed by the temperature, the balance between the charge current I1 and the discharge current I2 is constant. Similarly, even if there are production irregularities, the balance between the charge current I1 and the discharge current I2 can be maintained constant by using the same type of resistors for the R2 and R7.

In the circuit configuration of FIG. 8, because the NPN transistor Q10 is controlled by the charge current I1 and the discharge current I2 (push-pull operation), it is possible to perform switching of the NPN transistor Q10 at a high speed. Furthermore, because the bias circuit 17 of FIG. 8, as has been described above, also serves as a loop filter, the capacitor C1 and the resistors R7 and R8 determine the cut-off frequency, i.e., the loop band of the PLL. Moreover, because the loop filter is constituted only one stage using the NPN transistor Q10, it is possible to reduce the power source voltage used.

Figure 9:
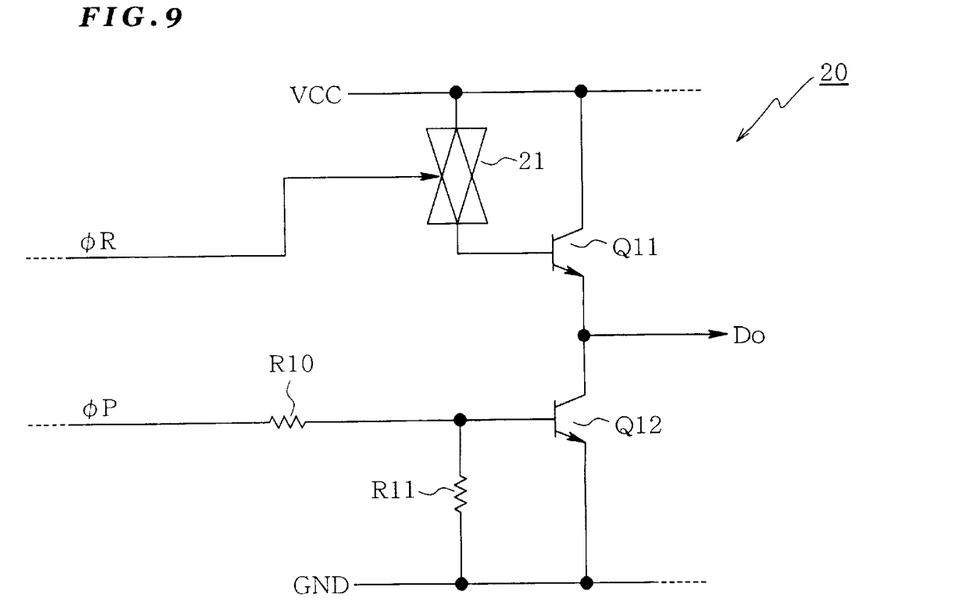
FIG. 9 is a circuit diagram showing a conventional charge pump circuit used in a PLL frequency synthesizer.

FIG. 9 shows a charge pump circuit in the PLL frequency synthesizer disclosed in Japanese Patent Publication No. 7-143002. In this charge pump circuit 20, an LPF (not depicted) is connected to the output Do corresponding to the CPout 11 in the present embodiment, and φR corresponds to the input signal CPin1 and φP corresponds to the input signal CPin2. When both of the φR and φP are low, the analog switch 21 is turned on. Accordingly, the base of the NPN transistor Q11 of a similar configuration as the diode connection becomes Vcc potential. Moreover, because the φP is low, the base of the NPN transistor Q12 is supplied with a voltage signal (Low, ground gnd) divided by the resistors R4 and R3, and the NPN transistor Q12 turns off. At this moment, electric charge is supplied from the NPN transistor Q11 to the LPF capacitor. This charge current equivalent to the I1 in this embodiment is rapidly charged because there is nothing to limit the current on the path from the NPN transistor Q11 to the capacitor to be charged. Here, from the transient viewpoint, if the capacitor not charged is assumed to be a ground potential, the power source voltage Vcc is connected to the ground gnd via the diode. Accordingly, the both ends of the diode are at potential of Vcc and a large current flows until the capacitor is charged.

Moreover, discharge is caused when both of φR and φP are high. When φR becomes high, the analog switch 21 turns off, the base potential of the NPN transistor Q11 becomes gnd potential, and the NPN transistor Q11 turns off. The φP becomes high level (=Vcc) and voltage (high) divided by the resistors R4 and R3 is applied to the NPN transistor Q12 and the NPN transistor Q12 is turned on. Here, electric charge is discharged from the LPF capacitor via the NPN transistor Q12. By this discharge, the base input signal of the NPN transistor Q12 becomes base-emitter voltage of the NPN transistor Q12, and a collector current corresponding to this voltage, i.e., a discharge current flows. In general, if it is assumed that the saturation current is Is, thermal voltage is VT (=kT/q), Boltzmann constant is k, absolute temperature is T, and electric charge q, then the collector current (Ic) can be expressed as follows: Ic=Is·exp($V_{BE}$/VT) and the collector current increases exponentially according to the $V_{BE}$.

As has been described above, in the conventional charge pump circuit 20 shown in FIG. 9, it is possible to perform charge and discharge operation at a high speed. However, there is no circuit to limit the current such as a constant current circuit and accordingly, it is quite difficult to have a balance of the charge current and the discharge current.

In contrast to this, in the charge pump circuit according to the present invention, the charge current I1 and the discharge current I2 are preferably balanced. Especially when the output signal CPout 11 is connected to an active filter (C1, R8) or the bias circuit of FIG. 8, if the input signal CPin1 is low and the input signal CPin2 is high, the NPN transistor Q1 turns off and the NPN transistors Q3, Q5, and Q6 turn on, and the base of the NPN transistor Q4 is biased by 3·$V_{BE}$. Moreover, the NPN transistor Q2 turns on, and no current flows into the NPN transistors Q7 and Q8, and the NPN transistors Q7 and Q8 turn off, and the NPN transistor Q9 also turns off. Here, the NPN transistors Q4 and Q10 turn on and the charge current I1 flows. The charge current I1 can be determined as follows. Because the base of the NPN transistor Q4 is 3·$V_{BE}$, considering the NPN transistor Q4, the resistor R7, and the NPN transistor Q10 as the current flow path, the voltage across the resistor R7 should be 1·$V_{BE}$. Accordingly, the charge current I1 is determined by $V_{BE}$/R7. That is, the charge current I1 is determined by the value of the resistor R7.

Moreover, the discharge current I2 can be considered as follows. In this case also, it is assumed that the active filter of FIG. 8 is connected to the CPout 11 of FIG. 2. When the input signal CPin1 is high and the input signal CPin2 is low, the circuit of the input signal CPin1 side turns off and the NPN transistor Q4 also turns off. In the circuit of the input signal CPin2 side, the NPN transistor Q2 turns off and accordingly, a current determined by the resistor R2, the NPN transistors Q7 and Q8 flows into this path. Because the NPN transistors Q8 and Q9 constitute a current mirror circuit, a current having the same value as the NPN transistor Q8, i.e., a discharge current I2 flows into the NPN transistor Q9. Because the discharge current I2 is determined by (Vcc−2·$V_{BE}$)/R2, if the power source voltage Vcc is constant, the discharge current I2 is determined by the value of the resistor R2. Thus, by setting the resistor R7 and the resistor R2 at appropriate values, it is possible to obtain preferably balanced charge/discharge currents.

Figure 10:
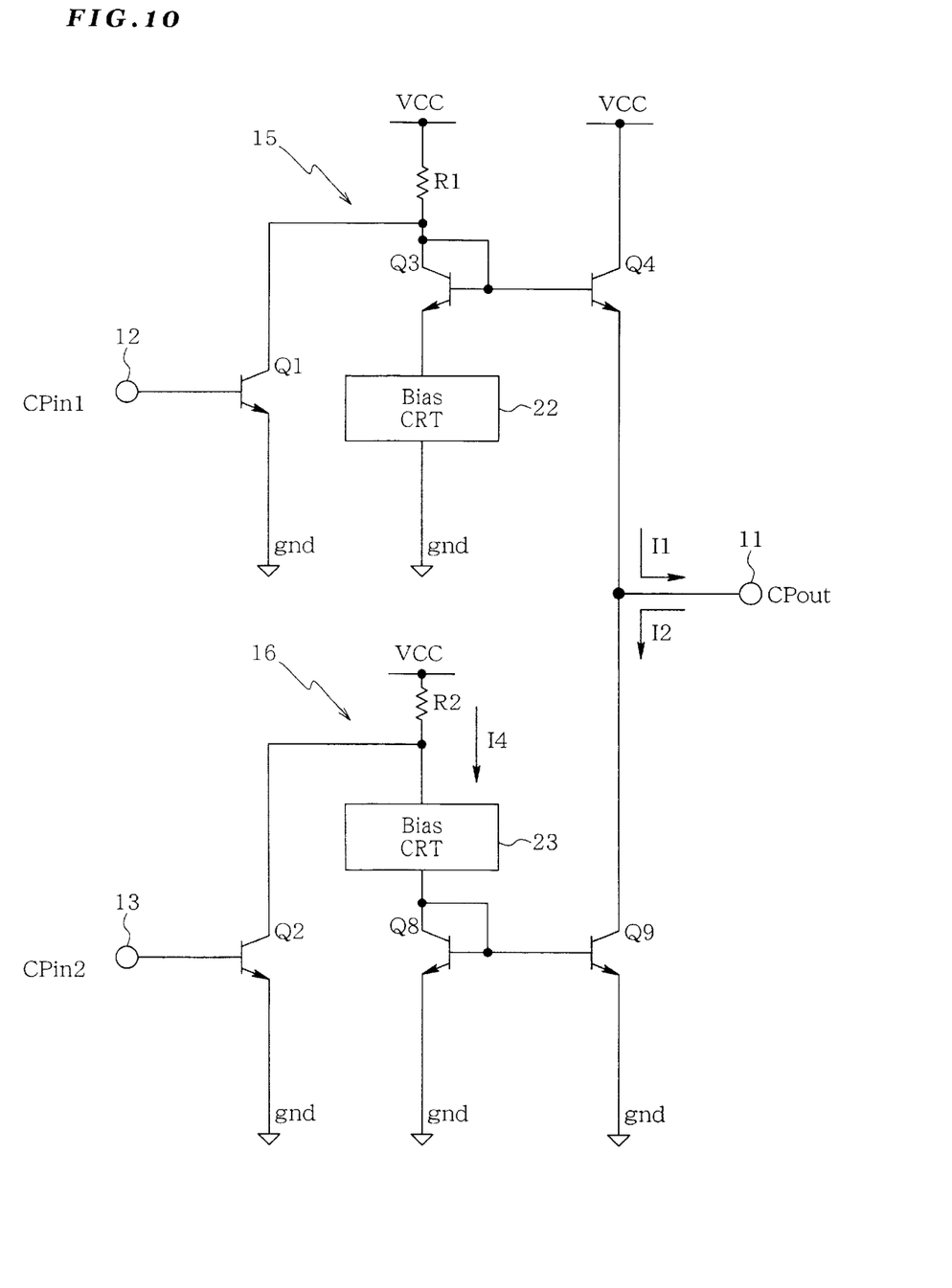
FIG. 10 shows a modified example of the charge pump circuit of FIG. 2.

FIG. 10 shows a partially modified example of the charge pump circuit of FIG. 2. In this example, the NPN transistors Q5 and Q6 in FIG. 2 are replaced by a bias circuit 22, and the NPN transistor Q7 is replaced by a bias circuit 23. The bias circuits 22 and 23 may have any configuration if the base potential of the transistors Q4 and Q9 can be biased so as to maintain a preferable balance of the charge current I1 and the discharge current I2. When using transistors in the bias circuits 22 and 23, all the transistors should be NPN transistors.

Figure 11:
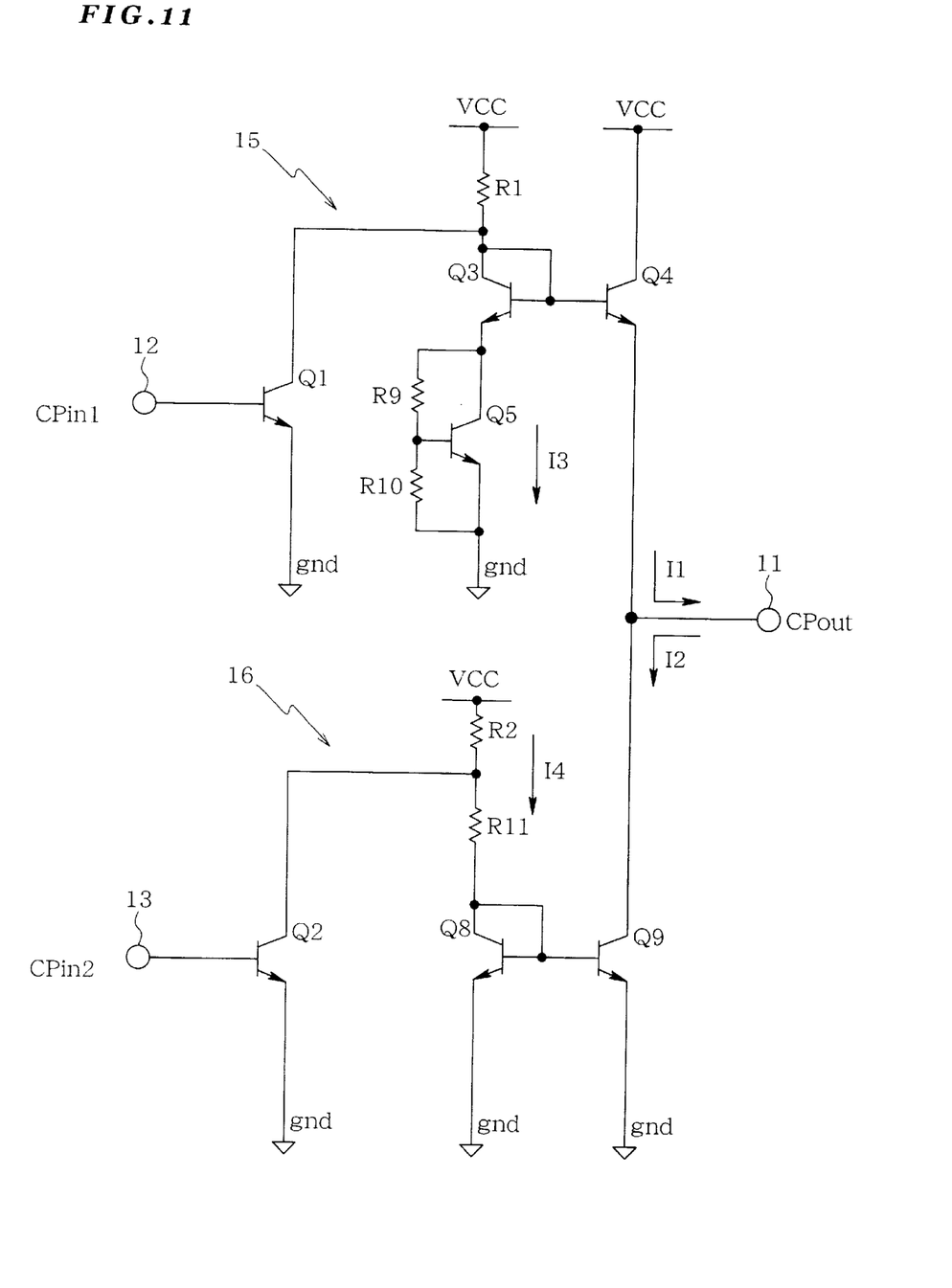
FIG. 11 shows a another modified example of the charge pump circuit of FIG. 2.

FIG. 11 shows another modified example of the charge pump circuit of FIG. 2. In this example, the NPN transistor Q6 is deleted, and the base of the NPN transistor Q5 is connected via the resistors R9 and R10 to the power source voltage Vcc side and the ground gnd side, respectively, so as to constitute a $V_{BE}$ multiplier circuit. The NPN transistor Q7 is replaced by a resistor R11.

In the charge pump circuit having the aforementioned configuration, if $V_{BE}$ is assumed to be a voltage between the base and emitter of the NPN transistor Q5, then the voltage ($V_{CE}$(Q5))between the collector and emitter of the NPN transistor Q5 is as follows, assuming VE(Q3) for the emitter potential of the NON transistor Q3 identical to $V_{CE}$(Q5).

$$V_{CE}(Q5)=(1+R3/R4)·V_{BE}$$

This enables to obtain multiplication of a voltage ($V_{BE}$) of one diode stage and accordingly the charge current I1 will be as follows.

$$I1=\{Vcc-(V_{BE}+V_{CE}(Q5))\}/R1=\{Vcc-(2+R3/R4)V_{BE}\}/R1$$

By adjusting the resistance values of the resistors R3 and R4, it is possible to preferably adjust the balance of the charge/discharge currents for fine control. At the side of the input signal CPin2, because of the replacement by the resistor R11, the discharge current I2 will be as follows.

$$I2=(Vcc-V_{BE})/(R2+R5)$$

This enables fine control of the current. Thus, with the modified example of FIG. 11, it is possible to obtain the same effects as the charge pump circuit of FIG. 2.

As has been described above, in the charge pump circuit of the present invention, the transistors used are all NPN bipolar transistors having a high cut-off frequency, and it is possible to utilize the NPN transistor switching, enabling a high-speed operation at a low voltage. In contrast to this, when the transistors used are all CMOS or combination of PNP transistors and NPN transistors, because the CMOS and PNP transistors have a slow transient frequency (fT) in the order of 100 MHz to several GHz, limiting the circuit operation, circuit operation of several MHz or above becomes difficult. However, in the charge pump circuit according to the present invention, all the transistors are NPN transistors and accordingly, the transient frequency (fT) becomes several GHz to several tens of GHz or above and the charge pump circuit can operate with several tens of MHz to several hundreds of MHz.

Moreover, in the present charge pump circuit, because the circuit operation is fast, especially when used in the PLL frequency synthesizer, a phase comparator can have a high phase comparison frequency. Normally, a spurious (reference leak) caused by modulation of the phase comparison frequency appears at a distance fc±fPD wherein fc is a carrier frequency and fPD is a phase comparison frequency. However, in this charge pump circuit, even if a spurious is caused, it is possible to keep away the spurious from the carrier frequency and it is possible to sufficiently remove the spurious by a low pass filter subsequent to the phase comparator. Furthermore, since NPN transistors having the same configuration can be formed on a single substrate, the production procedure and circuit configuration are simple in comparison to the case using a combination of MOS transistors and by polar transistors. Moreover, no capacitor is used excluding in the bias circuit, the number of devices is small, which reduces the production cost as well as reduces the lay-out area on the semiconductor chip, reducing the circuit size.

The present invention has been explained through a preferable embodiment. However, the charge pump circuit of the present invention is not to be limited to the aforementioned embodiment and can be modified in various way within the scope of the present invention.

As has been described above, the charge pump circuit of the present invention enables to make a phase comparison frequency a high frequency, to reduce spurious caused by the phase comparison frequency, to charge/discharge the loop filter at a later stage at a high speed and at a low power source voltage, and to obtain a high-speed synchronization processing.

The entire disclosure of Japanese Patent Application No. 11-022206 (Filed on Jan. 29, 1999) including specification, claims, drawings and summary are incorporated herein by reference in its entirety.

What is claimed is:

1. A charge pump circuit comprising:
   a first transistor connected between a first power source and an output node; and
   a second transistor connected between a second power source and said output node;
   wherein the first and the second transistors are controlled in response to a first signal and a second signal so as to control a current flowing into and out of the output node, said charge pump circuit further comprising:
   a first switch circuit connected between a base of the first transistor and a first input node through which the first signal is input and controlling the first transistor in response to the first signal, wherein the first switch circuit includes a bias circuit connected to the second power source;
   a second switch circuit connected between a base of the second transistor and a second input node through which the second signal is input and controlling the second transistor in response to the second signal;
   a phase comparator producing, as output signals, said first signal and said second signal, said first signal and said second signal being determined in accordance with a determination made by said phase comparator in response to a third signal and fourth signal being input to said phase comparator; and
   wherein the first and the second transistors and transistors contained in the first and the second switch circuits are all NPN transistors.

2. The charge pump circuit as claimed in claim 1, said circuit further comprising a bias circuit for biasing the output node to at least one of the first, the second and a third power source.

3. The charge pump circuit as claimed in claim 2, wherein said bias circuit comprises: a resistor having one end connected to the output node; and a DC power source having an anode connected to the other end of the resistor and a cathode connected to the second power source.

4. The charge pump circuit as claimed in claim 2, wherein said bias circuit comprises: a first resistor having one end connected to the first power source and the other end connected to the output node side; and a second resistor having one end connected to the second power source and the other end connected to the output node side.

5. The charge pump circuit as claimed in claim 2, wherein said bias circuit comprises: a bias transistor having a base connected to the output node and an emitter connected to the second power source; and a first resistor inserted between the collector of the bias transistor and the first power source,
   a connection node between the first resistor and the bias transistor being connected to a subsequent stage output node positioned at a subsequent stage of the output node.

6. A charge pump circuit comprising:
   a first transistor connected between a first power source and an output node; and
   a second transistor connected between a second power source and said output node;
   wherein the first and the second transistors are controlled in response to a first signal and a second signal so as to control a current flowing into and out of the output node, said charge pump circuit further comprising:
   a first switch circuit connected between a base of the first transistor and a first input node through which the first signal is input and controlling the first transistor in response to the first signal; and
   a second switch circuit connected between a base of the second transistor and a second input node through which the second signal is input and controlling the second transistor in response to the second signal;
   wherein the first and the second transistors and transistors contained in the first and the second switch circuits are all NPN transistors;
   wherein said first switch circuit comprises:
   a third transistor having a collector connected to the first power source via a first resistor and to the base of the third transistor, which base is connected to the base of the first transistor;
   a fourth transistor having a collector connected to the collector of the third transistor, an emitter connected to the second power source, and a base connected to the first input node; and
   a first bias circuit inserted between the third transistor and the second power source.

7. The charge pump circuit as claimed in claim 6, wherein the first bias circuit includes a plurality of transistors connected to operate as diodes.

8. The charge pump circuit as claimed in claim 6, wherein the first bias circuit includes:
   a bias transistor having a collector connected to an emitter of the third transistor and an emitter connected to the second power source;
   a second resistor connecting the base and collector of the bias transistor; and a third resistor connecting the base and emitter of the bias transistor.

9. The charge pump circuit as claimed in claim 6, wherein the second switch circuit comprises:
   a second bias circuit connected to the first power source via a second resistor;

a fifth transistor having a collector connected to the second bias circuit, an emitter connected to the second power source, and a base connected to the second input node;

a sixth transistor having a collector connected to the second bias circuit and to the base of the sixth transistor, which base is connected to the base of the second transistor so as to constitute a current mirror circuit, and an emitter connected to the second power source.

10. The charge pump circuit as claimed in claim 9, wherein the second bias circuit comprises a seventh transistor having a collector connected to the first power source via the second resistor and to the base of the seventh transistor, and an emitter connected to the collector of the sixth transistor.

11. The charge pump circuit as claimed in claim 9, wherein the second bias circuit comprises a third resistor having one end connected to the first power source via the second resistor and the other end connected to the collector of the sixth transistor.

12. A charge pump circuit comprising:

a first transistor connected between a first power source and an output node; and a second transistor connected between a second power source and said output node;

wherein the first and the second transistors are controlled in response to a first signal and a second signal so as to control a current flowing into and out of the output node, said charge pump circuit further comprising:

a first switch circuit connected between a first input node through which the first signal is input and a base of the first transistor and controlling the first transistor in response to the first signal; and a second switch circuit connected between a second input node through which the second signal is input and a base of the second transistor and controlling the second transistor in response to the second signal;

wherein the first and the second transistors and transistors contained in the first and the second switch circuits are all NPN transistors;

said circuit further comprising a bias circuit for biasing the output node, wherein said bias circuit comprises:

a bias transistor having a base connected to the output node and an emitter connected to the second power source; and a first resistor inserted between the collector of the bias transistor and the first power source, a connection node between the first resistor and the bias transistor being connected to a subsequent stage output node positioned at a subsequent stage of the output node, wherein the bias circuit further comprises:

a second resistor inserted between the output node and the base of the bias transistor; and a series circuit constituted by a third resistor and a capacitor inserted in a return path connecting a connection between the first resistor and the subsequent stage output node, with a connection between the base of the bias transistor and the second resistor.

* * * * *